United States Patent
Sim et al.

(10) Patent No.: US 11,108,023 B2
(45) Date of Patent: Aug. 31, 2021

(54) ORGANIC LIGHT EMITTING DIODE DISPLAY DEVICE

(71) Applicant: LG DISPLAY CO., LTD., Seoul (KR)

(72) Inventors: Dong-Min Sim, Paju-si (KR); Ji-Hyang Jang, Paju-si (KR); Jin-Tae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 6 days.

(21) Appl. No.: 16/455,363

(22) Filed: Jun. 27, 2019

(65) Prior Publication Data

US 2020/0006709 A1     Jan. 2, 2020

(30) Foreign Application Priority Data

Jun. 29, 2018 (KR) .................. 10-2018-0075227

(51) Int. Cl.
*H01L 51/52* (2006.01)
*H01L 27/32* (2006.01)
*H01L 51/50* (2006.01)

(52) U.S. Cl.
CPC ...... *H01L 51/5275* (2013.01); *H01L 27/3225* (2013.01); *H01L 51/5253* (2013.01)

(58) Field of Classification Search
CPC .................................................. H01L 51/5262
See application file for complete search history.

(56) References Cited

U.S. PATENT DOCUMENTS

| | | | |
|---|---|---|---|
| 2008/0122347 A1* | 5/2008 | Lee | H01L 51/5262 313/504 |
| 2009/0206733 A1* | 8/2009 | Hwang | H01L 51/5268 313/504 |
| 2010/0006845 A1 | 1/2010 | Seo et al. | |
| 2014/0159023 A1 | 6/2014 | Matsumoto et al. | |
| 2014/0346449 A1* | 11/2014 | Choi | H01L 51/5268 257/40 |
| 2017/0288161 A1 | 10/2017 | Kim et al. | |
| 2018/0175327 A1 | 6/2018 | Jang et al. | |

FOREIGN PATENT DOCUMENTS

| | | |
|---|---|---|
| DE | 112015002810 T5 | 3/2017 |
| KR | 10-2015-0001485 A | 1/2015 |
| KR | 10-2016-0043200 A | 4/2016 |
| KR | 10-2016-0084282 A | 7/2016 |
| KR | 10-2017-0026962 A | 3/2017 |

* cited by examiner

*Primary Examiner* — Omar F Mojaddedi
(74) *Attorney, Agent, or Firm* — Birch, Stewart, Kolasch & Birch, LLP

(57) ABSTRACT

An organic light emitting diode display device includes a substrate, an overcoating layer on the substrate and including a plurality of convex portions and a plurality of concave portions, a first electrode on the overcoating layer, a light emitting layer on the first electrode and including a first emitting material layer, and a second electrode on the light emitting layer, wherein the first emitting material layer in the plurality of convex portions is separated from the second electrode by a first distance, and the first emitting material layer in the plurality of concave portions is separated from the second electrode by a second distance different from the first distance.

13 Claims, 10 Drawing Sheets

ORGANIC LIGHT EMITTING DIODE DISPLAY DEVICE

CROSS REFERENCE TO RELATED APPLICATIONS

The present application claims the priority benefit of Korean Patent Application No. 10-2018-0075227 filed in Republic of Korea on Jun. 29, 2018, which is hereby incorporated by reference in its entirety for all purposes as if fully set forth herein.

BACKGROUND OF THE INVENTION

Field of the Invention

The present invention relates to an organic light emitting diode display device, and more particularly, to an organic light emitting diode display device where a light extraction efficiency is improved.

Discussion of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

Among the various flat panel display devices, an organic light emitting diode (OLED) display device is an emissive type device and does not require a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since inner elements of the OLED display device have a solid phase, the OLED display device has high durability against an external impact and has a wide available temperature range.

In the OLED display device, while light emitted from a light emitting layer passes through various components and is emitted to an exterior, a large amount of the light is lost. As a result, the light emitted to the exterior of the OLED display device is only 20% of the light emitted from the light emitting layer.

Here, since the amount of the light emitted from the light emitting layer is increased along with the amount of a current applied to the OLED display device, it is possible to further increase luminance of the OLED display device by applying more currents to the light emitting layer. However, in this case, power consumption is increased, and lifetime of the OLED display device is also reduced.

Therefore, to improve a light extraction efficiency of the OLED display device, an OLED display device where a microlens array (MLA) is attached to an outer surface of a substrate or a microlens is formed in an overcoating layer has been suggested.

However, when the microlens array is attached to the outer surface of the substrate or the microlens is formed in the overcoating layer, a visibility of a black color is deteriorated due to a relatively high reflectance.

SUMMARY OF THE INVENTION

Accordingly, the present invention is directed to an organic light emitting diode display device that substantially obviates one or more of the problems due to limitations and disadvantages of the related art.

An object of the present invention is to provide an organic light emitting diode display device where a light extraction efficiency is improved and a visibility of a black color is improved by reducing a reflectance.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes a substrate; an overcoating layer on the substrate and including a plurality of convex portions and a plurality of concave portions; a first electrode on the overcoating layer; a light emitting layer on the first electrode and including a first emitting material layer; and a second electrode on the light emitting layer, wherein the first emitting material layer in the plurality of convex portions is separated from the second electrode by a first distance, and wherein the first emitting material layer in the plurality of concave portions is separated from the second electrode by a second distance different from the first distance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the present disclosure, examples of which are illustrated in the accompanying drawings.

Figure 1:
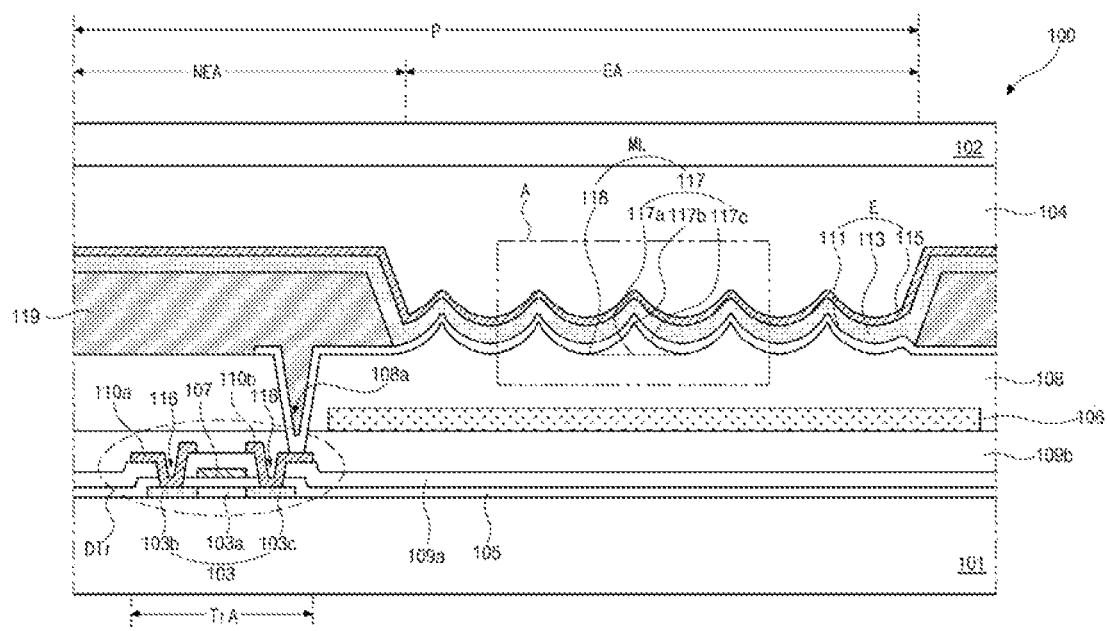
FIG. 1 is a cross-sectional view showing an organic light emitting diode display device according to an embodiment of the present disclosure.

FIG. 1 is a cross-sectional view showing an organic light emitting diode display device according to an embodiment of the present disclosure. All the components of the organic light emitting diode display devices according to all embodiments of the present disclosure are operatively coupled and configured.

In FIG. 1, an organic light emitting diode (OLED) display device 100 can have a top emission type or a bottom emission type according to an emission direction of a light. A bottom emission type OLED display device can be exemplarily illustrated hereinafter.

The OLED display device 100 includes a substrate having a driving thin film transistor (TFT) DTr and a light emitting diode E thereon and a protecting film 102 encapsulating the substrate 101.

The substrate 101 includes a plurality of pixel regions P and each pixel region P includes an emitting area EA where the light emitting diode E is disposed and an image is substantially displayed and a non-emitting area NEA along an edge of the emitting area EA. The non-emitting area NEA includes a switching area TrA where the driving TFT DTr is disposed.

A semiconductor layer 103 is disposed in the switching area TrA of the non-emitting area NEA of the pixel region P on the substrate 101. The semiconductor layer 103 can include silicon and can have an active region 103a in a central portion and source and drain regions 103b and 103c in both side portions of the active region 103a. The active region 103a can function as a channel of the driving TFT DTr, and the source and drain regions 103b and 103c can be doped with impurities of a relatively high concentration.

A gate insulating layer 105 is disposed on the semiconductor layer 103.

A gate electrode 107 and a gate line are disposed on the gate insulating layer 105. The gate electrode 107 corresponds to the active region 103a of the semiconductor layer 103, and the gate line is connected to the gate electrode 107 to extend along one direction.

A first interlayer insulating layer 109a is disposed on the gate electrode 107 and the gate line. The first insulating layer 109a and the gate insulating layer 105 has first and second semiconductor contact holes 116 exposing the source and drain regions 103b and 103c in both side portions of the active region 103a.

Source and drain electrodes 110a and 110b spaced apart from each other are disposed on the first interlayer insulating layer 109a having the first and second semiconductor contact holes 116. The source electrode 110a is connected to the source region 103b through the first semiconductor contact hole 116, and the drain electrode 110b is connected to the drain region 103c through the second semiconductor contact hole 116.

A second interlayer insulating layer 109b is disposed on the source and drain electrodes 110a and 110b and the first interlayer insulating layer 109a exposed between the source and drain electrodes 110a and 110b.

The source and drain electrodes 110a and 110b, the semiconductor layer 103 including the source and drain regions 103b and 103c contacting the source and drain electrodes 110a and 110b, respectively, the gate insulating layer 105 and the gate electrode 107 constitute the driving TFT DTr.

A data line can be disposed on the second interlayer insulating layer 109b. The data line can cross the gate line to define each pixel region P. A switching TFT having the same structure as the driving TFT DTr can be connected to the driving TFT DTr.

The switching TFT and the driving TFT DTr can exemplarily have a top gate type where the semiconductor layer 103 includes polycrystalline silicon or an oxide semiconductor material. The switching TFT and the driving TFT DTr can have a bottom gate type where the semiconductor layer 103 includes intrinsic amorphous silicon and impurity-doped amorphous silicon in another embodiment.

The substrate 101 can include a glass or a flexible transparent plastic such as polyimide. For example, polyimide tolerant of a deposition step of a relatively high temperature due to an excellent thermal resistance can be used for the substrate 101. A whole front surface of the substrate of polyimide can be covered with at least one buffer layer.

A threshold voltage of the driving TFT DTr in the switching area TrA can be shifted by a light. To prevent the threshold voltage shift, the OLED display device 100 can further include a light shielding layer under the semiconductor layer 103.

The light shielding layer can be disposed between the substrate 101 and the semiconductor layer 103 to block a light incident to the semiconductor layer 103 through the substrate 101. As a result, the threshold voltage shift by the external light is minimized or prevented. The light shielding layer can be covered with the at least one buffer layer.

A wavelength converting layer 106 is disposed on the second interlayer insulating layer 109b corresponding to the emitting area EA of each pixel region P.

The wavelength converting layer 106 can include a color filter transmitting only a light having a wavelength of a predetermined color corresponding to each pixel region P among a white light emitted from the light emitting diode E to the substrate 101.

The wavelength converting layer 106 can transmit only a light having a wavelength corresponding to a red color, a green color or a blue color. For example, in the OLED display device 100, a single unit pixel region can include red, green and blue pixel regions P, and the wavelength converting layer 106 in the red, green and blue pixel regions P can include red, green and blue color filters, respectively.

In the OLED display device 100, the single unit pixel region can further include a white pixel region where the wavelength converting layer 106 is not disposed.

In another embodiment, the wavelength converting layer 106 can include a quantum dot which have a size capable of emitting a light of a predetermined color corresponding to each pixel region P according to a white light emitted from the light emitting diode E to the substrate 101. Here, the quantum dot can include at least one selected from a group including CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and SbTe. However, a material of the quantum dot is not limited thereto.

For example, the wavelength converting layer 106 in the red pixel region can include a quantum dot of CdSe or InP, the wavelength converting layer 106 in the green pixel region can include a quantum dot of CdZnSeS, and the wavelength converting layer 106 in the blue pixel region can include a quantum dot of ZnSe. The OLED display device 100 where the wavelength converting layer 106 includes a quantum dot can have a relatively high color reproducibility.

In another embodiment, the wavelength converting layer (106) can include a color filter containing a quantum dot.

An overcoat layer 108 which has a first drain contact hole 108a exposing the drain electrode 110b with the second interlayer insulating layer 109b is disposed on the wavelength converting layer 106. The overcoating layer 108 has a plurality of concave portions 118 and a plurality of convex portions 117 on a top surface thereof. The plurality of concave portions 118 and the plurality of convex portions 117 are alternately disposed with each other to constitute a microlens ML.

The overcoating layer 108 can include an insulating material having a refractive index of 1.5. For example, the overcoating layer 108 can include one of acrylic resin, epoxy resin, phenol resin, polyamide resin, polyimide resin, unsaturated polyester resin, polyphenylene resin, polyphenylenesulfide resin, benzocyclobutene and photoresist.

The plurality of convex portions 117 can have a structure to define or surround the plurality of concave portions 118, respectively, and can have a bottom surface portion 117a, a top surface portion 117b and a side surface portion 117c. The side surface portion 117c can be a whole of a slanted surface constituting the top surface portion 117b. A slope of the side surface portion 117c can increase from the bottom surface portion 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 increases.

A first electrode 111 connected to the drain electrode 110b of the driving TFT DTr is disposed on the overcoating layer 108 constituting the microlens ML. For example, the first electrode 111 can be an anode of the light emitting diode E and can include a material having a relatively high work function.

The first electrode 111 is disposed in each pixel region P, and a bank 119 is disposed between the first electrodes 111 in the adjacent pixel regions P. The first electrode 111 is separated in each pixel region P with the bank 119 as a border between the adjacent pixel regions P.

The bank 119 includes an opening exposing the first electrode 111, and the opening of the bank 119 is disposed to corresponds to the emitting area EA. The plurality of convex portions 117 and the plurality of concave portions 118 constituting the microlens ML are disposed in a whole of the opening of the bank 119. For example, the plurality of convex portions 117 and the plurality of concave portions 118 can contact an edge portion of the bank 119.

Further, the opening of the bank 119 is disposed to correspond to the wavelength converting layer 106. For example, the edge portion of the bank 119 can overlap an edge portion of the wavelength converting layer 106. Since the wavelength converting layer 106 overlaps the bank 119, a leakage of a light not passing through the wavelength converting layer 106 is prevented.

A light emitting layer 113 is disposed on the first electrode 111. The light emitting layer 113 can have a single layer of an emitting material. Alternatively, the light emitting layer 113 can have a multiple layer including a hole injecting layer, a hole transporting layer, an emitting material layer, an electron transporting layer and an electron injecting layer for increasing an emission efficiency.

The first electrode 111 and the light emitting layer 113 sequentially on the overcoating layer 108 can have a shape according to a morphology of the plurality of convex portions 117 and the plurality of concave portions 118 of the top surface of the overcoating layer 108 to constitute the microlens ML.

The light emitting layer 113 can have different thicknesses in the convex portion 117 and the concave portion 118 of the microlens ML.

The thickness of the light emitting layer 113 in a region corresponding to the side surface portion 117c of the convex portion 117 of the microlens ML can be smaller than the thickness of the light emitting layer 113 in a region corresponding to the concave portion 118 of the microlens ML. The thickness of the light emitting layer 113 can be defined as a length perpendicular to a tangential line C1 and C2 (of FIG. 2) of the top and bottom surfaces of the light emitting layer 113.

In the OLED display device 100, since the light emitting layer 113 has different thicknesses in the convex portion 117 and the concave portion 118 constituting the microlens ML, a distance from the second electrode 115 to the emitting material layers 203a, 203b and 203c (of FIG. 3) of the light emitting layer 113 in the concave portion 118 of the microlens ML is different from a distance from the second electrode 115 to the emitting material layers 203a, 203b and 203c of the light emitting layer 113 in the side surface portion 117c of the convex portion 117 of the microlens ML.

Accordingly, in the OLED display device 100, the emitting material layers 203a, 203b and 203c are disposed in the light emitting layer 113 constituting the microlens ML.

Since the emitting material layers 203a, 203b and 203c are disposed at specific positions in the light emitting layer 113 constituting the microlens ML, the light extraction efficiency of the light emitted from the light emitting diode E increases and the visibility of the black color is improved.

A second electrode 115 is disposed on a whole of the light emitting layer 113. For example, the second electrode 115 can be a cathode.

The second electrode 115 can have a shape according to a morphology of the plurality of convex portions 117 and the plurality of concave portions 118 of the top surface of the overcoating layer 108 to constitute the microlens ML.

When a voltage is applied to the first and second electrodes 111 and 115 according to a signal, a hole injected from the first electrode 111 and an electron injected from the second electrode 115 are transmitted to the light emitting layer 113 to constitute an exciton. When the exciton transitions from an excited state to a ground state, a light can be emitted from the light emitting layer 113 as a visible ray.

The light of the light emitting layer 113 can pass through the transparent first electrode 111 to be emitted toward an exterior such that an image is displayed.

Since the overcoating layer 108 constitutes the microlens ML, the light confined in the interior of the light emitting layer 113 due to a total reflection can be transmitted with an angle smaller than a critical angle of the total reflection by the microlens ML of the overcoating layer 108 to be extracted to the exterior by a multiple reflection. As a result, the light extraction efficiency of the OLED lighting apparatus 100 is improved.

In addition, since the microlens ML of the overcoating layer 108, the first electrode 111, the light emitting layer 113 and the second electrode 115 is disposed in a whole of the opening of the bank 119 corresponding to the emitting area EA, the whole of the emitting area EA is used for the microlens ML and the light extraction efficiency is maximized.

A protecting film 102 of a thin film type is disposed on the driving TFT DTr and the light emitting diode E second electrode 115, and a face seal 104 is disposed between the light emitting diode E and the protecting film 102. The face seal 104 can include an organic material or an inorganic material which is transparent and has an adhesive property. The protecting film 102 and the substrate 101 can be attached to each other to encapsulate the OLED display device 100.

To prevent penetration of an external oxygen and a moisture into an interior of the OLED display device 100, the protecting film 102 can include at least two inorganic protecting films. An organic protecting film for supplementing impact resistance of the at least two inorganic protecting films can be interposed between the at least two inorganic protecting films.

In the structure where the organic protecting film and the inorganic protecting film are alternately laminated with each other, the inorganic protecting film can completely wrap the organic protecting film such that penetration of the moisture and the oxygen through a side surface of the organic protecting film is prevented.

As a result, penetration of the moisture and the oxygen from the exterior to the interior of the OLED display device 100 can be prevented.

In the OLED display device 100, a polarizing plate for preventing reduction of a contrast ratio due to an external light can be disposed on an outer surface of the transparent substrate 101. Since the polarizing plate is disposed on a surface of the OLED display device 100 in a driving mode where a light from the light emitting layer 113 is emitted, the contrast ratio increases.

In the OLED display device 100, since the emitting material layers 203a, 203b and 203c are disposed at specific positions in the light emitting layer 113 constituting the microlens ML due to the overcoating layer 108, the light extraction efficiency of the light emitted from the light emitting diode E increases and the visibility of the black color is improved.

Figure 2:
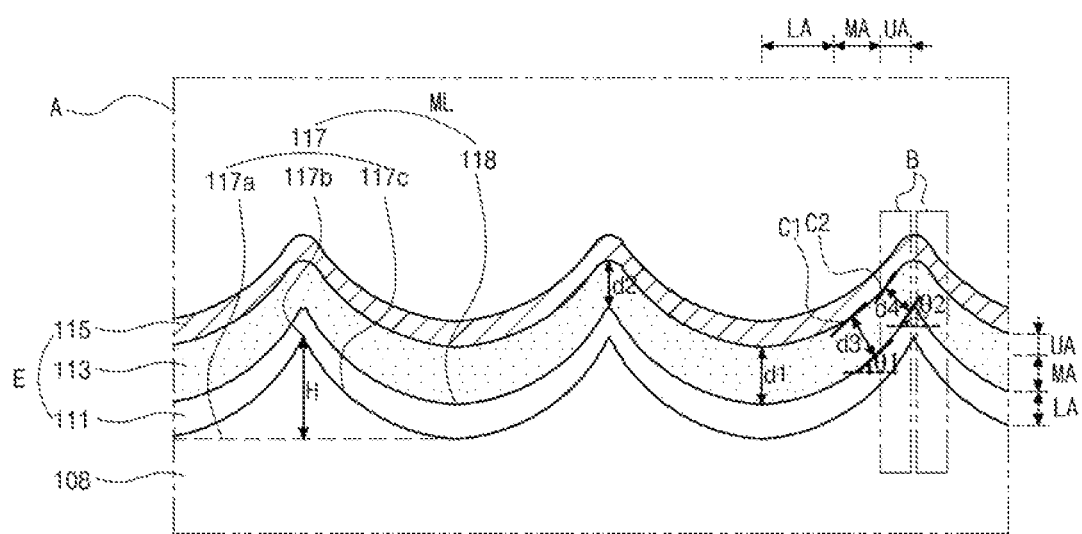
FIG. 2 is a magnified view of A of FIG. 1.

FIG. 2 is a magnified view of A of FIG. 1.

In FIG. 2, the first electrode 111, the light emitting layer 113 and the second electrode 115 are sequentially disposed on the overcoating layer 108 having the microlens ML of the plurality of concave portions 118 and the plurality of convex portions 117 alternating with each other. The first electrode 111, the light emitting layer 113 and the second electrode 115 constitute the light emitting diode E.

The first electrode 111, the light emitting layer 113 and the second electrode 115 have a shape according to a morphology of the top surface of the overcoating layer 108 to constitute the microlens ML.

Each convex portion 117 can have a bottom surface portion 117a, a top surface portion 117b and a side surface portion 117c. The side surface portion 117c can be a whole of a slanted surface constituting the top surface portion 117c.

The side surface portion 117c can be divided into a lower region LA, a middle region MA and an upper region UA according to a total height H between the bottom surface portion 117a and the top surface portion 117b. The lower region LA can be defined as a region from the bottom surface portion 117a to a half of the total height H (H/2).

The middle region MA between the lower region LA and the upper region UA. can be defined as a region from the half of the total height H (H/2) to four fifth of the total height H (4H/5). The upper region UA can be defined as a region from the four fifth of the total height H (4H/5) to the top surface portion 117b.

To further increase the light extraction efficiency of the light emitting layer 113, the convex portion 117 of the overcoating layer 108 can have a structure where the top surface portion 117b has a sharp shape. For example, the convex portion 117 can have a cross-section of triangle shape including a vertex corresponding to the top surface portion 117b, a bottom side corresponding to the bottom surface portion 117a and a hypotenuse corresponding to the side surface portion 117c.

An angle $\theta 1$ and $\theta 2$ of the side surface portion 117c of the convex portion 117 of the overcoating layer 108 can gradually increase from the bottom surface portion 117a to the top surface portion 117b. The angle $\theta 1$ and $\theta 2$ is defined as an angle between the tangential line C1 and C2 of the side surface portion 117c and a horizontal surface (i.e., the bottom surface portion 117a). The side surface portion 117c can have the maximum slope Smax when the angle $\theta 1$ and $\theta 2$ becomes the maximum value. The slope can be defined by a tangent value of the angle ($\tan \theta$).

Since the angle $\theta 1$ and $\theta 2$ of the side surface portion 117c gradually increases from the bottom surface portion 117a to the top surface portion 117b, the side surface portion 117c of the convex portion 117 of the overcoating layer 108 has the maximum slope Smax in the upper region UA adjacent to the top surface portion 117b.

The first electrode 111, the light emitting layer 113 and the second electrode 115 on the overcoating layer 108 having the microlens ML of the concave portion 118 and the convex portion 117 have the microlens ML on the top surface thereof. The convex portion 117 can include the bottom surface portion 117a, the tope surface portion 117b and the side surface portion 117c, and the side surface portion 117c can include the upper region UA, the middle region MA and the lower region LA.

In the OLED display device 100, since the light emitting layer 113 is disposed on the overcoating layer 108 constituting the microlens ML, the light emitting layer 113 can have different thicknesses d1, d2, d3 and d4 in different regions. The light emitting layer 113 can be formed to have the different thicknesses d1, d2, d3 and d4 corresponding to the concave portion 118 and the convex portion 117 of the microlens ML.

The thickness of the light emitting layer 113 can be defined as a length perpendicular to the tangential line C1 and C2 of the light emitting layer 113. For example, the third and fourth thicknesses d3 and d4 of the light emitting layer 113 of the side surface portion 117c of the convex portion 117 of the microlens ML can be smaller than the first and second thicknesses d1 and d2 of the light emitting layer 113 of the concave portion 118 and the top surface portion 117b of the convex portion 117.

The thickness d3 and d4 of the light emitting layer 113 of the side surface portion 117c of the convex portion 117 can gradually decrease from the lower region LA to the upper region UA.

Since the light emitting layer 113 is formed on the overcoating layer 108 having the microlens ML, the side surface portion 117c of the convex portion 117 of the overcoating layer 108 can have the angle θ1 and θ2 gradually increasing from the bottom surface 117a to the top surface portion 117b. As a result, the third and fourth thicknesses d3 and d4 of the light emitting layer 113 of the side surface portion 117c are smaller than the first and second thicknesses d1 and d2 of the light emitting layer 113 of the concave portion 118 and the top surface portion 117b.

Since the angle θ1 and θ2 of the side surface portion 117c gradually increases from the lower region LA to the upper region UA, the light emitting layer 113 of the side surface portion 117c can have the fourth thickness d4 as the minimum value in the upper region UA where the angle θ2 has a relatively great value and can have the third thickness d3 as the maximum value in the middle region MA where the angle θ1 has a relatively small value.

For example, the first thickness d1 can be equal to or greater than the second thickness d2, the second thickness d2 can be greater than the third thickness d3, and the third thickness d3 can be greater than the fourth thickness d4, e.g., d1≥d2>d3>d4.

In the light emitting diode E, the light emission occurs in a region having a relatively high current density. Since the light emitting layer 113 has a relatively small thickness d4 in the upper region UA of the convex portion 117, the light emitting layer 113 can have a relatively high current density and a relatively strong light emission in the upper region UA of the convex portion 117. In addition, since the light emitting layer 1113 has a relatively great thickness d1 in the lower region LA of the convex portion 117, the light emitting layer 113 can have a relatively low current density and a relatively weak light emission in the lower region LA of the convex portion 117. As a result, the upper region UA of each of the plurality of convex portions 117 where the strong light emission occurs can be defined as an effective emission region B. When the light emitting diode E is driven, an electric field is locally concentrated on the effective emission region B. As a result, a main current path is constituted and a main emission occurs in the effective emission region B.

The light emitting layer 113 has the main emission in the effective emission region B having a relatively small thickness d4 as compared with the top surface portion 117b of the convex portion 117 and the concave portion 118. Since the emitting material layers 203a, 203b and 203c are disposed at specific positions in the light emitting layer 113 based on the thickness of the light emitting layer 113 in the effective emission region B, the light extraction efficiency of the light emitted from the light emitting diode E increases and the visibility of the black color is improved.

The light emitting layer 113 constituting the microlens ML is formed to satisfy following equations based on the effective emission region B so that the light extraction efficiency can increase and the visibility of the black color can be improved.

$$T2 = T1 * \cos \theta \quad \text{[Equation 1]}$$

Here, T1 is the first thickness d1 of the light emitting layer 113 in the concave portion 118, and T2 is the fourth thickness d4 of the light emitting layer 113 in the effective emission region B of the side surface portion 117c of the convex portion 117. Further, θ is the second angle θ2 of the second tangential line C2 of the side surface portion 117c of the convex portion 117 in the effective emission region B with respect to the horizontal surface (i.e., the bottom surface portion 117a).

When the side surface portion 117c has the maximum slope Smax, the side surface portion 117c has the maximum angle θmax and the thickness T2 of the light emitting layer 113 can be obtained from the equation of T2=T1*cos θmax. As a result, T2 can be determined as the fourth thickness d4 of the light emitting layer 113.

For example, the maximum angle θmax of the tangential line C2 of the side surface portion 117c in the effective emission region B with respect to the horizontal surface (i.e., the bottom surface portion 117a) can be 20 degree to 60 degree. When the maximum angle θmax is smaller than 20 degree, the transmission angle of the light in the light emitting layer 113 having the microlens ML is not greatly changed as compared with the transmission angle of the light in a flat light emitting layer. As a result, the light extraction efficiency is insufficiently improved.

When the maximum angle θmax is greater than 60 degree, the transmission angle of the light in the light emitting layer 113 becomes greater than the critical angle of the total reflection at an interface of the substrate 101 (of FIG. 1) and an external air layer. As a result, the amount of the light confined in the OLED display device 100 increases and the light extraction efficiency of the light emitting layer 113 having the microlens ML decreases as compared with the light extraction efficiency of a flat light emitting layer.

Accordingly, the maximum angle θmax of the side surface portion 117c can be determined within a range of 20 degree to 60 degree in the effective emission region B of the convex portion 117 of the overcoating layer 108.

Based on the Equation 1, a distance from the second electrode 115 of the light emitting layer 113 to the emitting material layers 203a, 203b and 203c can be defined according to a following Equation 2.

$$L = D * \cos \theta \quad \text{[Equation 2]}$$

Here, D is a distance from the second electrode 115 to the emitting material layers 203a, 203b and 203c of the light emitting layer 113 in the concave portion 118. L is a distance from the second electrode 115 to the emitting material layers 203a, 203b and 203c of the light emitting layer 113 in the side surface portion 117c of the convex portion 117 where the main emission occurs. Further, cos θ is a parameter to compensate a reduced thickness of the light emitting layer 113 in the effective emission region B due to the second angle θ constituting the slope.

Based on the Equations 1 and 2, since the light emitting layer 113 having the microlens ML has different thicknesses d1, d2, d3 and d4 in the convex portion 117 and the concave portion 118, the distance from the second electrode 115 to the emitting material layers 203a, 203b and 203c of the light emitting layer 113 in the concave portion 118 is different from the distance from the second electrode 115 to the emitting material layers 203a, 203b and 203c of the light emitting layer 113 in the side surface portion 117c of the convex portion 117.

In the OLED display device 100, the side surface portion 117c of the convex portion 117 constituting the microlens ML is defined as the effective emission region B of the light emitting layer 113. The emitting material layers 203a, 203b and 203c are disposed at specific positions in the light emitting layer 113 based on the shape of the convex portion 117 according to the Equations 1 and 2. Since the emitting material layers 203a, 203b and 203c are disposed at specific positions in the light emitting layer 113 based on the effective emission region B of the side surface portion 117c of the convex portion 117, the light extraction efficiency further increases.

Further, in the OLED display device 100, since the emitting material layers 203a, 203b and 203c are disposed at specific positions in the light emitting layer 113 based on the effective emission region B according to a following Equation 3, the visibility of the black color is improved.

$$Y = L*(1/\cos\theta); L \leq Y \quad \text{[Equation 3]}$$

In the above, Y is a target thickness of the emitting material layers 203a, 203b and 203c of the light emitting layer 113 for evaporation. Y can be a distance from the second electrode 115 to the emitting material layers 203a, 203b and 203c of the light emitting layer 113 in the concave portion 118. L is defined by $D*\cos\theta$ according to the Equation 2.

As a result, the distance from the second electrode 115 to the emitting material layers 203a, 203b and 203c of the light emitting layer 113 in the side surface portion 117c of the convex portion 117 corresponding to the effective emission region B is equal to or smaller than the distance from the second electrode 115 to the emitting material layers 203a, 203b and 203c of the light emitting layer 113 in the concave portion 118.

Based on the thicknesses d1, d2, d3 and d4 of the light emitting layer 113 in the concave portion 118 and the convex portion 117 of the microlens ML satisfying the Equation 3, the thickness of the light emitting layer 113 in the effective emission region B on the overcoating layer 108 can be determined within a range of 3000 Å to 3500 Å.

The thickness of the light emitting layer 113 obtained by using the Equations 2 and 3 can be determined such that the OLED display device 100 has a micro cavity effect.

The micro cavity effect is a phenomenon such that a light of a wavelength is strengthened by a constructive interference and a light of the other wavelengths is weakened by a destructive interference when a light reflects between mirrors. As a result, an intensity of a light of a predetermined wavelength can increase by the micro cavity effect. In the OLED display device 100, the distance of the emitting material layers 203a, 203b and 203c of the light emitting layer 113 of the microlens ML in the effective emission region B can be determined such that the light emitting layer 113 has the micro cavity effect.

For example, the distance L from the second electrode 115 to the emitting material layers 203a, 203b and 203c of the light emitting layer 113 in the side surface portion 117c of the convex portion 117 corresponding to the effective emission region B can be determined such that the emitting material layers 203a, 203b and 203c of the light emitting layer 113 has the micro cavity effect, and the distance Y from the second electrode 115 to the emitting material layers 203a, 203b and 203c of the light emitting layer 113 in the concave portion 118 can be determined according to the Equation 3.

As a result, the light extraction efficiency of the light emitted from the light emitting diode E can increase, and deterioration of the visibility of a black color due to a relatively high reflectance can be prevented.

Figure 3:
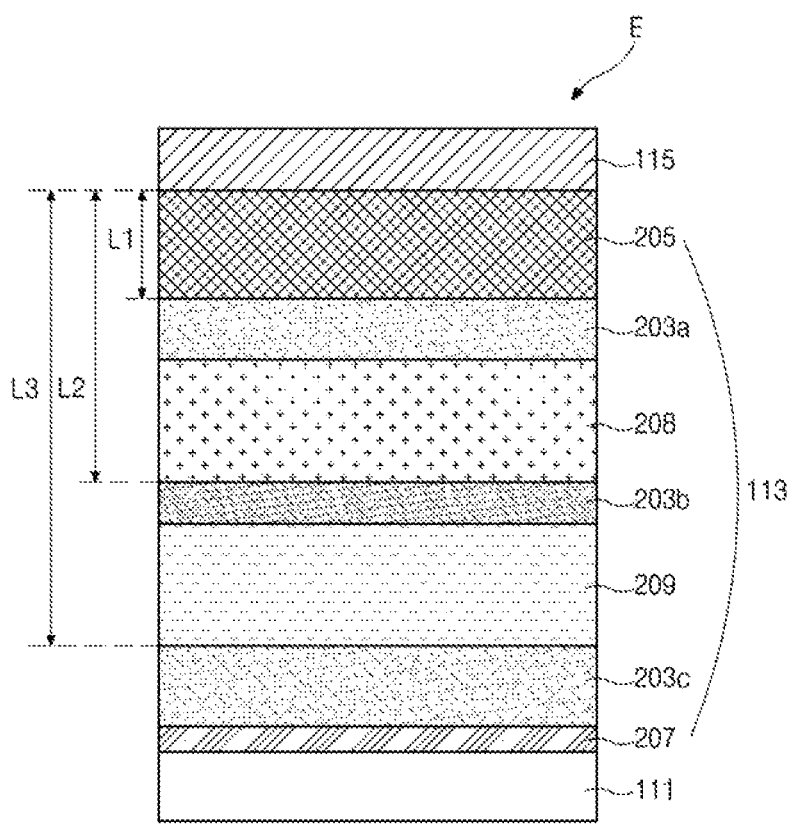
FIG. 3 is a cross-sectional view showing a light emitting diode of an organic light emitting diode display device according to an embodiment of the present disclosure.

FIG. 3 is a cross-sectional view showing a light emitting diode of an organic light emitting diode display device according to an embodiment of the present disclosure.

In FIG. 3, the light emitting diode E includes the first and second electrodes 111 and 115 and the light emitting layer 113 between the first and second electrodes 111 and 115, and the light emitting layer 113 includes first, second and third emitting material layers (EMLs) 203a, 203b and 203c.

The first electrode 111 can be an anode supplying a hole and having a relatively great work function. For example, the first electrode 111 can include one of a metal oxide such as indium tin oxide (ITO) and indium zinc oxide (IZO), a mixture of a metal and an oxide such as zinc oxide and aluminum (ZnO:Al) and tin oxide and antimony (SnO2:Sb) and a conductive polymer such as poly(3-methylthiophene), poly [3,4-(ethylene-1,2-dioxy)thiophene] (PEDT), polypyrrole and polyaniline. In addition, the first electrode 111 can include one of carbon nano tube (CNT), graphene and silver nano wire.

The second electrode 115 can be a cathode supplying an electron and having a relatively small work function. For example, the second electrode 115 can have a single layer of an alloy of a first metal (e.g., Ag) having a relatively small work function and a second metal (e.g., Mg), a double layer of the first and second metals, or a multiple layer of the alloy of the first and second metals.

The second electrode 115 can be a reflective electrode and the first electrode 111 can be a transflective electrode. Alternatively, the first electrode 111 can be a reflective electrode and the second electrode 115 can be a transparent electrode. For example, at least one of the first and second electrodes 111 and 115 can be a reflective electrode.

The second electrode 115 can include a material having a reflectance equal to or greater than 90% in a visible ray band, and the first electrode 111 can include a material having a transmittance equal to or greater than 80% in the visible ray band. For example, the visible ray band can be a wavelength band of 380 nm to 800 nm.

When the second electrode 115 has a reflectance equal to or greater than 90%, most of a light from the light emitting layer 113 to the second electrode 115 can be reflected by the second electrode 115 to proceed toward the first electrode 111. In addition, when the first electrode 111 has a transmittance equal to or greater than 80%, a large amount of the light can pass through the first electrode 111.

The second electrode 115 can have a thickness of 90 nm to 120 nm for increasing a reflectance in the visible ray band. However, a thickness of the second electrode 115 is not limited thereto and can vary according to a material of the second electrode 115. The first electrode 111 can have a thickness of 115 nm to 135 nm for increasing a transmittance in the visible ray band. However, a thickness of the first electrode 111 is not limited thereto and can vary according to a material of the first electrode 111.

A first electron transporting layer (ETL) 205 is disposed between the second electrode and the first emitting material layer 203a, and a first auxiliary layer 208 is disposed between the first emitting material layer 203a and the second emitting material layer 203b. A second auxiliary layer 209 is disposed between the second emitting material layer 203b and the third emitting material layer 203c, and a first hole transporting layer (HTL) 207 is disposed between the third emitting material layer 203c and the first electrode 111.

An electron injecting layer (EIL) can be disposed between the second electrode 115 and the first electron transporting layer 205. The electron injecting layer can assist injection of the electron from the second electrode 115 to the first electron transporting layer 205.

The first electron transporting layer 205 can have at least two layers or can include at least two materials. A hole blocking layer (HBL) can be disposed between the first electron transporting layer 205 and the first emitting material layer 203a. Since the hole blocking layer prevents transmission of a hole injected into the first emitting material layer 203a to the first electron transporting layer 205, combination of a hole and an electron is improved in the first emitting material layer 203a and an emission efficiency of the first emitting material layer 203a is improved.

The first electron transporting layer 205 and the hole blocking layer can be formed as a single layer. The electron injecting layer, the first electron transporting layer 205 and the hole blocking layer can be referred to as an electron transmitting layer.

An electron is supplied from the second electrode 115 to the first emitting material layer 203a through the first electron transporting layer 205, and a hole is supplied from the first auxiliary layer 208 to the first emitting material layer 203a. The electron supplied through the first electron transporting layer 205 and the hole supplied from the first auxiliary layer 208 are recombined in the first emitting material 203a to generate a light.

The first emitting material layer 203a can emit a light of a first color. The first emitting material layer 203a can include one of a blue emitting layer, a deep blue emitting layer and a sky blue emitting layer. The light emitted from the first emitting material layer 203a can have a wavelength of 440 nm to 480 nm.

The first emitting material layer 203a can include at least one host and at least one dopant or a mixed host where at least two hosts are mixed and at least one dopant. When the mixed host includes a host having a hole transporting property and a host having an electron transporting property, a charge balance of the first emitting material layer 203a can be adjusted and an efficiency of the first emitting material layer 203a can be improved. The dopant can include a fluorescent dopant or a phosphorescent dopant.

The first auxiliary layer 208 can include a second hole transporting layer adjacent to the first emitting material layer 203a and a second electron transporting layer adjacent to the second emitting material layer 203b.

A hole injecting layer can be disposed between the second hole transporting layer and the second emitting material layer 203b, and an electron injecting layer can be disposed between the second electron transporting layer and the first emitting material layer 203a.

An electron blocking layer (EBL) can be disposed between the first emitting material layer 203a and the second hole transporting layer. Since the electron blocking layer prevents transmission of an electron injected into the first emitting material layer 203a to the second hole transporting layer, combination of a hole and an electron is improved in the first emitting material layer 203a and an emission efficiency of the first emitting material layer 203a is improved.

In addition, a hole blocking layer (HBL) can be disposed between the second electron transporting layer and the second emitting material layer 203b. Since the hole blocking layer prevents transmission of a hole injected into the second emitting material layer 203b to the second electron transporting layer, combination of a hole and an electron is improved in the second emitting material layer 203b and an emission efficiency of the second emitting material layer 203b is improved.

The electron blocking layer and the second hole transporting layer can be formed as a single layer, and the second electron transporting layer and the hole blocking layer can be formed as a single layer. The hole injecting layer, the second hole transporting layer and the electron blocking layer can be referred to as a hole transporting layer, and the electron injecting layer, the second electron transporting layer and the hole blocking layer can be referred to as an electron transmitting layer.

A first charge generating layer (CGL) can be disposed between the second hole transporting layer and the second electron transporting layer of the first auxiliary layer 208. The first charge generating layer can adjust a charge balance between the first emitting material layer 203a and the second emitting material layer 203b. For example, the hole injecting layer can be disposed between the second hole transporting layer and the first charge generating layer, and the electron injecting layer can be disposed between the first charge generating layer and the second electron transporting layer.

The first charge generating layer can include a positive type charge generating layer (P-CGL) and a negative type charge generating layer (N-CGL). The positive type charge generating layer can supply a hole to the first emitting material layer 203a, and the negative type charge generating layer can supply an electron to the second emitting material layer 203b.

An electron is supplied from the first auxiliary layer 208 to the second emitting material layer 203b, and a hole is supplied from the second auxiliary layer 209 to the second emitting material layer 203b. The electron supplied from the first auxiliary layer 208 and the hole supplied from the second auxiliary layer 209 are recombined in the second emitting material 203b to generate a light.

The second emitting material layer 203b can emit a light of a second color. The second emitting material layer 203b can include one of a yellow-green emitting layer, a green emitting layer, a yellow-green emitting layer and a red emitting layer, a yellow emitting layer and a red emitting layer, and a green emitting layer and a red emitting layer.

When the second emitting material layer 203b includes a yellow-green emitting layer, the light emitted from the second emitting material layer 203b can have a wavelength of 510 nm to 580 nm. When the second emitting material layer 203b includes a yellow-green emitting layer and a red emitting layer, the light emitted from the second emitting material layer 203b can have a wavelength of 510 nm to 650 nm.

When the second emitting material layer 203b includes a yellow emitting layer and a red emitting layer, the light emitted from the second emitting material layer 203b can have a wavelength of 540 nm to 650 nm. When the second emitting material layer 203b includes a green emitting layer and a red emitting layer, the light emitted from the second emitting material layer 203b can have a wavelength of 510 nm to 650 nm.

The second emitting material layer 203b can include at least one host and at least one dopant or a mixed host where at least two hosts are mixed and at least one dopant. When the mixed host includes a host having a hole transporting property and a host having an electron transporting property, a charge balance of the second emitting material layer 203b can be adjusted and an efficiency of the second emitting material layer 203b can be improved. The dopant can include a fluorescent dopant or a phosphorescent dopant.

The second auxiliary layer 209 can include a third hole transporting layer adjacent to the second emitting material layer 203b and a third electron transporting layer adjacent to the third emitting material layer 203c.

A hole injecting layer can be disposed between the third hole transporting layer and the third emitting material layer 203c, and an electron injecting layer can be disposed between the third electron transporting layer and the second emitting material layer 203b.

An electron blocking layer (EBL) can be disposed between the second emitting material layer 203b and the third hole transporting layer. Since the electron blocking layer prevents transmission of an electron injected into the third second emitting material layer 203b to the third hole transporting layer, combination of a hole and an electron is improved in the second emitting material layer 203b and an emission efficiency of the second emitting material layer 203b is improved.

In addition, a hole blocking layer (HBL) can be disposed between the third electron transporting layer and the third emitting material layer 203c. Since the hole blocking layer prevents transmission of a hole injected into the third emitting material layer 203c to the third electron transporting layer, combination of a hole and an electron is improved in the third emitting material layer 203c and an emission efficiency of the third emitting material layer 203c is improved.

The electron blocking layer and the third hole transporting layer can be formed as a single layer, and the third electron transporting layer and the hole blocking layer can be formed as a single layer. The hole injecting layer, the third hole transporting layer and the electron blocking layer can be referred to as a hole transporting layer, and the electron injecting layer, the third electron transporting layer and the hole blocking layer can be referred to as an electron transmitting layer.

A second charge generating layer (CGL) can be disposed between the third hole transporting layer and the third electron transporting layer of the second auxiliary layer 209. The second charge generating layer can adjust a charge balance between the second emitting material layer 203b and the third emitting material layer 203c. For example, the hole injecting layer can be disposed between the third hole transporting layer and the second charge generating layer, and the electron injecting layer can be disposed between the second charge generating layer and the third electron transporting layer.

The second charge generating layer can include a positive type charge generating layer (P-CGL) and a negative type charge generating layer (N-CGL). The positive type charge generating layer can supply a hole to the second emitting material layer 203b, and the negative type charge generating layer can supply an electron to the third emitting material layer 203c.

An electron is supplied from second auxiliary layer 209 to the third emitting material layer 203c, and a hole is supplied from the first electrode 111 to the third emitting material layer 203c through the first hole transporting layer 207. The electron supplied from the second auxiliary layer 209 and the hole supplied through the first hole transporting layer 207 are recombined in the third emitting material 203c to generate a light.

The third emitting material layer 203c can emit a light of a third color the same as the first color of the light of the first emitting material layer 203a. The third emitting material layer 203c can include one of a blue emitting layer, a deep blue emitting layer and a sky blue emitting layer. The light emitted from the third emitting material layer 203c can have a wavelength of 440 nm to 480 nm.

The third emitting material layer 203c can include at least one host and at least one dopant or a mixed host where at least two hosts are mixed and at least one dopant. When the mixed host includes a host having a hole transporting property and a host having an electron transporting property, a charge balance of the third emitting material layer 203c can be adjusted and an efficiency of the third emitting material layer 203c can be improved. The dopant can include a fluorescent dopant or a phosphorescent dopant.

In the OLED display device 100, the light emitting diode E includes three emitting material layers 203a, 203b and 203c between the first electrode 111 and the second electrode 115. In another embodiment, the light emitting diode can include two emitting material layers.

Since the distances from the second electrode 115 to the first, second and third emitting material layers 203a, 203b and 203c are determined according to the Equation 2, the first, second and third emitting material layers 203a, 203b and 203c are disposed to correspond to the micro lens ML of the light emitting layer 113 such that the light emitting diode E has a micro cavity effect. As a result, the light extraction efficiency of the OLED display device 100 is improved.

The positions of the first, second and third emitting material layers 203a, 203b and 203c in the light emitting layer 113 can be determined according to following Equations 4, 5 and 6.

$$L1=D1*\cos\theta, \text{ where } \theta=20°\text{-}60° \quad \text{[Equation 4]}$$

$$L2=D2*\cos\theta, \text{ where } \theta=20°\text{-}60° \quad \text{[Equation 5]}$$

$$L3=((D2+D3)/2)*\cos\theta, \text{ where } \theta=20°\text{-}60° \quad \text{[Equation 6]}$$

In the above, D1, D2 and D3 are first, second and third distances from second electrode 115 to the first, second and third emitting material layers 203a, 203b and 203c, respectively, of the light emitting layer 113 in the concave portion 118. L1, L2 and L3 are first, second and third distances from the second electrode 115 to the first, second and third emitting material layers 203a, 203b and 203c, respectively, of the light emitting layer 113 in the side surface portion 117c of the convex portion 117 where the main emission occurs.

The first, second and third distances D1, D2 and D3 in the concave portion 118 of the light emitting layer 113 are different from the first, second and third distances L1, L2 and L3 in the convex portion 117 of the effective emission region B of the light emitting layer 113. The first, second and third distances L1, L2 and L3 in the convex portion 117 of the effective emission region B of the light emitting layer 113 can be obtained from the light emitting diode E having the micro cavity, and the first, second and third distances D1, D2 and D3 in the concave portion 118 of the light emitting layer 113 can be obtained from the Equations 4, 5 and 6. The first, second and third distances D1, D2 and D3 can be used as target thicknesses for deposition of the first, second and third emitting material layers 203a, 203b and 203c. As a result, the light extraction efficiency of the OLED display device 100 is improved.

For example, a thickness from an upper surface of the first electrode 111 of an anode to a lower surface of the second electrode 115 of a cathode can be within a range of 4900 Å to 5300 Å. The first distance D1 from the second electrode 115 to the first emitting material layer 203a can be within a range of 555 Å to 615 Å (585 Å with a margin of error of ±5%), the second distance D2 from the second electrode 115 to the second emitting material layer 203b can be within a range of 2735 Å to 3025 Å (2880 Å with a margin of error of ±5%), and the third distance D3 from the second electrode 115 to the third emitting material layer 203c can be within a range of 3450 Å to 3815 Å (3630 Å with a margin of error of ±5%).

In the OLED display device 100, when the first electrode 111 is a transparent electrode transmitting a light and the second electrode 115 is a transflective electrode transmitting a part of a light and reflecting the other part of the light, a light efficiency can be improved due to a micro cavity effect between the first electrode 111 and the second electrode 115.

The micro cavity effect is a phenomenon such that a constructive interference of a light occurs due to repetition of reflection and re-reflection between the first electrode 111 and the second electrode 115 and a light efficiency is improved. For a constructive interference, the first, second and third emitting material layers 203a, 203b and 203c emitting a light can be disposed at resonance positions between the first electrode 111 and the second electrode 115 according to a wavelength. The resonance position can correspond to a resonance distance from the second electrode 115, and the resonance distance can be obtained from a integer multiple of a half of the wavelength of the emitted light.

When the first, second and third emitting material layers 203a, 203b and 203c are disposed at the resonance positions, the light of the corresponding wavelength is strengthened by a constructive interference and is extracted to an exterior with an increased intensity. Further, the light of the other wavelength is weakened by a destructive interference and is extracted to an exterior with a decreased intensity.

Since only the light efficiency of the light having the wavelength corresponding to the resonance distance is improved due to the micro cavity effect, the lights emitted from the first, second and third emitting material layers 203a, 203b and 203c have different emission spectrums according to a length of light path when the lights are extracted through the first electrode 111. As a result, the first, second and third emitting material layers 203a, 203b and 203c are disposed at the resonance positions corresponding to the resonance distances for improving the light efficiency using the micro cavity effect.

Specifically, in the OLED display device 100, since the light emitting layer 113 constitutes the microlens ML where the light emitting layer 113 has different thicknesses d1, d2, d3 and d4 in the convex portion 117 and the concave portion 118, the first, second and third emitting material layers 203a, 203b and 203c of the effective emission region B of the light emitting layer 113 are disposed at the resonance positions. As a result, the light efficiency of the OLED display device 100 is improved due to the micro cavity effect.

Figure 4A:
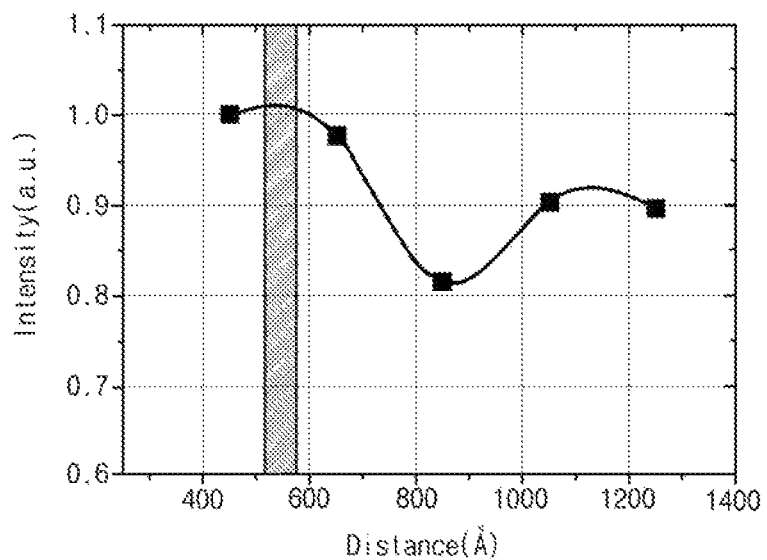
FIGS. 4A, 4B and 4C are graphs showing an intensity of a light according to a position of first, second and third emitting material layers, respectively, of an organic light emitting diode display device according to an embodiment of the present disclosure.
Figure 4B:
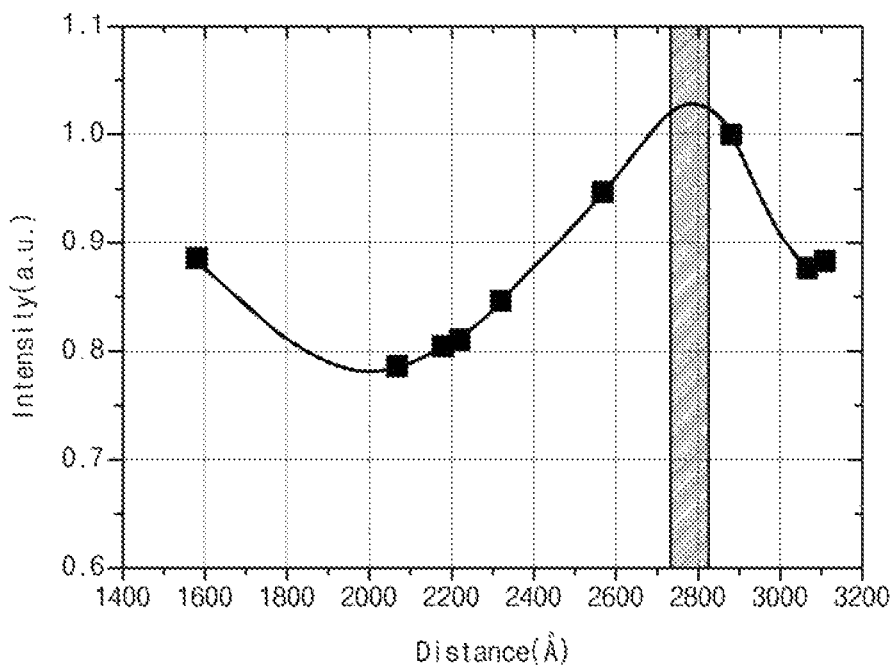
Figure 4C:
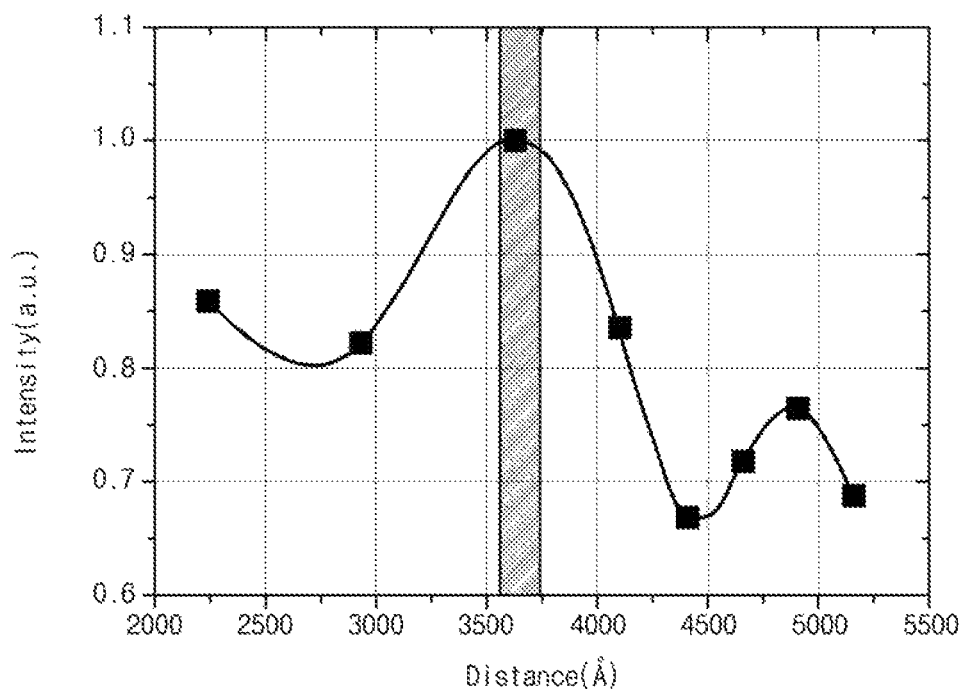

FIGS. 4A, 4B and 4C are graphs showing an intensity of a light according to a position of first, second and third emitting material layers, respectively, of an organic light emitting diode display device according to an embodiment of the present disclosure.

In FIG. 4A, when the first emitting material layer 203a emitting a light of a wavelength of 440 nm to 480 nm has a distance of 555 Å to 615 Å from the second electrode 115, the intensity of the light has the maximum value and the first emitting material layer 203a has the maximum light efficiency.

In FIG. 4B, when the second emitting material layer 203b emitting a light of a wavelength of 510 nm to 590 nm has a distance of 2735 Å to 3025 Å from the second electrode 115, the intensity of the light has the maximum value and the second emitting material layer 203b has the maximum light efficiency.

In FIG. 4C, when the third emitting material layer 203c emitting a light of a wavelength of 440 nm to 480 nm has a distance of 3450 Å to 3815 Å from the second electrode 115, the intensity of the light has the maximum value and the third emitting material layer 203c has the maximum light efficiency.

Accordingly, the first emitting material layer 203a is disposed at the first position having the distance of 585 Å (with a margin of error of ±5%) corresponding to the range of 555 Å to 615 Å. The second emitting material layer 203b is disposed at the second position having the distance of 2880 Å (with a margin of error of ±5%) corresponding to the range of 2735 Å to 3025 Å. The third emitting material layer 203c is disposed at the third position having the distance of 3630 Å (with a margin of error of ±5%) corresponding to the range of 3450 Å to 3815 Å.

In the OLED display device 100 where the light emitting layer 113 constitutes the microlens ML where the light emitting layer 113 has different thicknesses d1, d2, d3 and d4 in the convex portion 117 and the concave portion 118, since the first, second and third emitting material layers 203a, 203b and 203c of the effective emission region B of the light emitting layer 113 are disposed at the resonance positions based on the microlens ML, the light efficiency of the OLED display device 100 is improved due to the micro cavity effect.

Figure 5A:
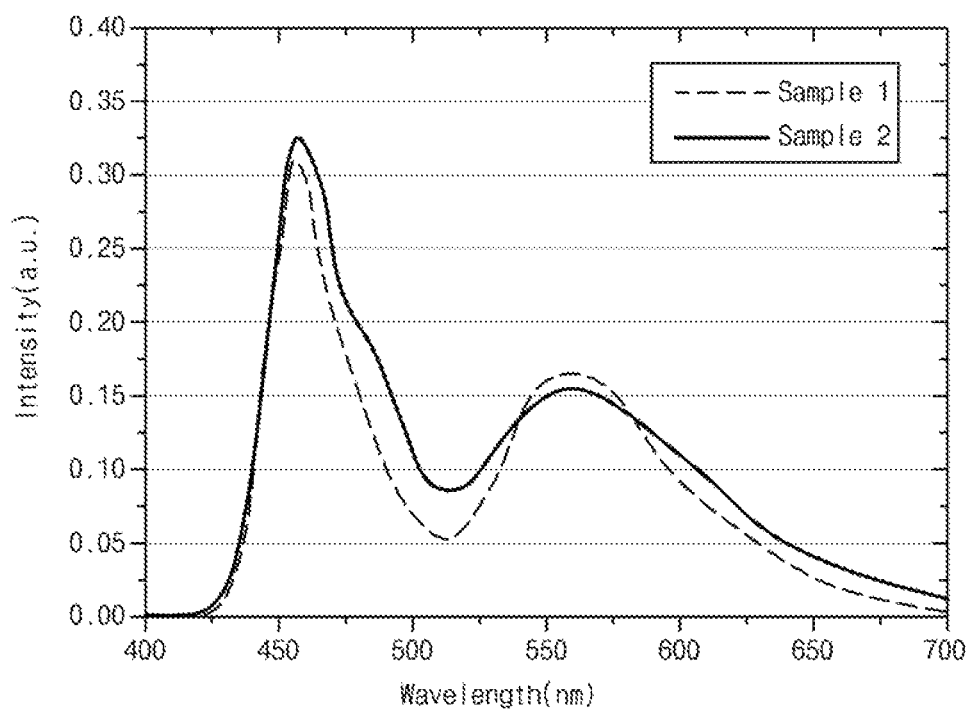
FIGS. 5A and 5B are graphs showing an intensity of a light according to a wavelength of a light extracted from an organic light emitting diode display device having a microlens and an organic light emitting diode display device according to an embodiment of the present disclosure, respectively.
Figure 5B:
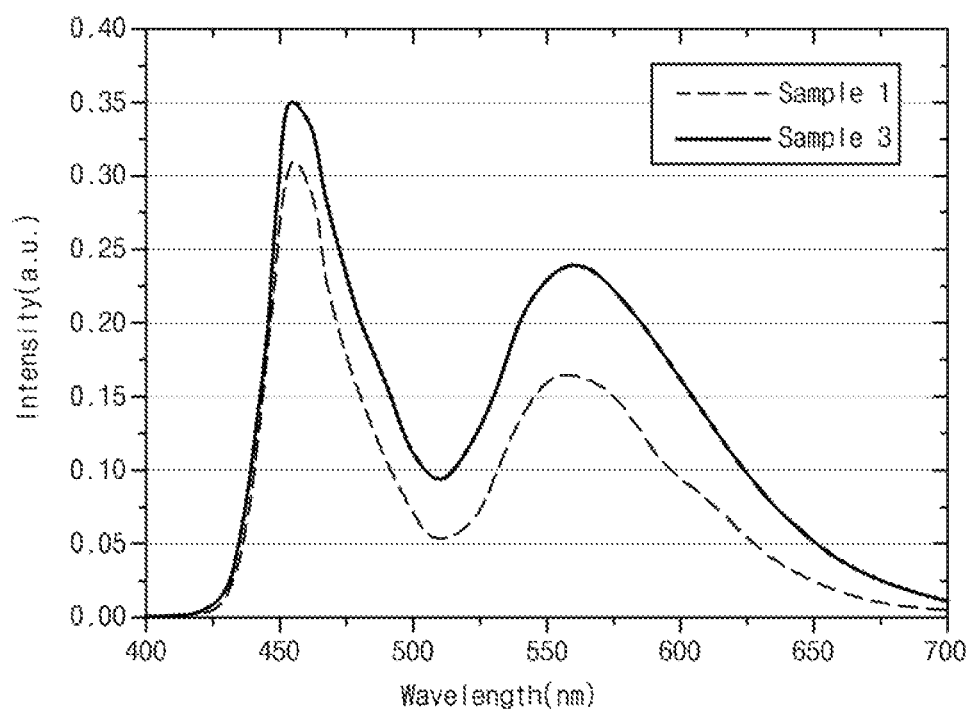

FIGS. 5A and 5B are graphs showing an intensity of a light according to a wavelength of a light extracted from an organic light emitting diode display device having a microlens and an organic light emitting diode display device according to an embodiment of the present disclosure, respectively.

In FIGS. 5A and 5B, a sample 1 corresponds to an organic light emitting diode display device according to the related art, a sample 2 corresponds to an organic light emitting diode display device having a microlens without a micro cavity effect, and a sample 3 corresponds to an organic light emitting diode display device 100 having a microlens with a microcavity effect according to an embodiment of the present disclosure.

The x-axis represents a wavelength of a light and the y-axis represents an intensity of a light. The intensity is a relative value with respect to the maximum of the emission spectrum. For example, the value of 0.34 (a.u.) of the blue emission spectrum is the maximum and the relative value of the yellow-green emission spectrum with respect to the maximum is shown.

In FIG. 5A, the sample 2 has the higher emission spectrum as compared with the sample 1.

The OLED display device (sample 2) having the microlens ML (of FIG. 2) of the overcoating layer 108 (of FIG. 2) without the microcavity effect has the greater light amount in the visible ray band as compared with the OLED display device (sample 1) without the microlens.

In FIG. 5B, the sample 3 has the higher emission spectrum as compared with the sample 2 as well as the sample 1.

The OLED display device 100 (sample 3) having the microlens ML of the overcoating layer 108 with the microcavity effect has the greater light amount in the visible ray band as compared with the OLED display device (sample 2) having the microlens ML without the microcavity effect. The OLED display device 100 (sample 3) has the greater light extraction efficiency as compared with the OLED display device (sample 2) as well as the OLED display device (sample 1).

In the light emitting diode E of the OLED display device 100, the distances L1, L2 and L3 from the second electrode 115 to the emitting material layers 203a, 203b and 203c in the convex portion 117 of the effective emission region B can be determined such that the microlens ML has the micro cavity effect, and the target thicknesses Y1, Y2 and Y3 which are the distances from the second electrode 115 to the emitting material layers 203a, 203b and 203c in the concave portion 118 can be determined according to the Equation 3. As a result, the visibility of the black color is improved.

For example, the distances of the first, second and third emitting material layers 203a, 203b and 203c can be determined according to following Equations 7, 8 and 9.

$$Y1=L1*(1/\cos \theta); L1 \leq Y1; \theta=20°\text{-}60°$$ [Equation 7]

$$Y2=L2*(1/\cos \theta); Y2*\cos 60° \leq L2 \leq Y2*\cos 20°; \theta=20°\text{-}60°$$ [Equation 8]

$$Y3=L3*(1/\cos \theta); Y3*\cos 60° \leq L3 \leq Y3*\cos 20°; \theta=20°\text{-}60°$$ [Equation 9]

In the above, Y1, Y2 and Y3 are the first, second and third distances from the second electrode 115 to the first, second and third emitting material layers 203a, 203b and 203c of the light emitting layer 113 in the concave portion 118. For example, Y1, Y2 and Y3 are within a range of 3000 Å to 3500 Å.

Further, L1, L2 and L3 are the first, second and third distances from the second electrode 115 to the first, second and third emitting material layers 203a, 203b and 203c of the light emitting layer 113 in the convex portion 117 of the effective emission region B.

The OLED display device 100 where the visibility of the black color is improved is obtained by determining the first, second and third distances Y1, Y2 and Y3 according to the Equations 7, 8 and 9.

In the Equations 8 and 9, cos 60° (–0.5) is used for the minimum thickness of the emitting material layers 203b and 203c corresponding to the maximum slope of the maximum angle θ of the convex portion 117 of the microlens ML, and cos 20° (–0.94) is used for the maximum thickness of the emitting material layers 203b and 203c corresponding to the minimum slope of the minimum angle θ of the convex portion 117 of the microlens ML. Since the first emitting material layer 203a is disposed adjacent to the second electrode 115, the light emitted from the first emitting material layer 203a can be absorbed by the second electrode 115 due to a surface plasmon phenomenon. When the thickness of the first emitting material layer 203a is decreased, the light extraction effect of the first emitting material layer 203a can be reduced. As a result, the minimum value of the distance L1 from the second electrode 115 to the first emitting material layer 203a is omitted in the Equation 7.

According to the Equations 7, 8 and 9, the first distance L1 can be determined within a range of 280 Å to 300 Å, the second distance L2 can be determined within a range of 2150 Å to 2550 Å, and the third distance L3 can be determined within a range of 3000 Å to 3500 Å.

Figure 6:
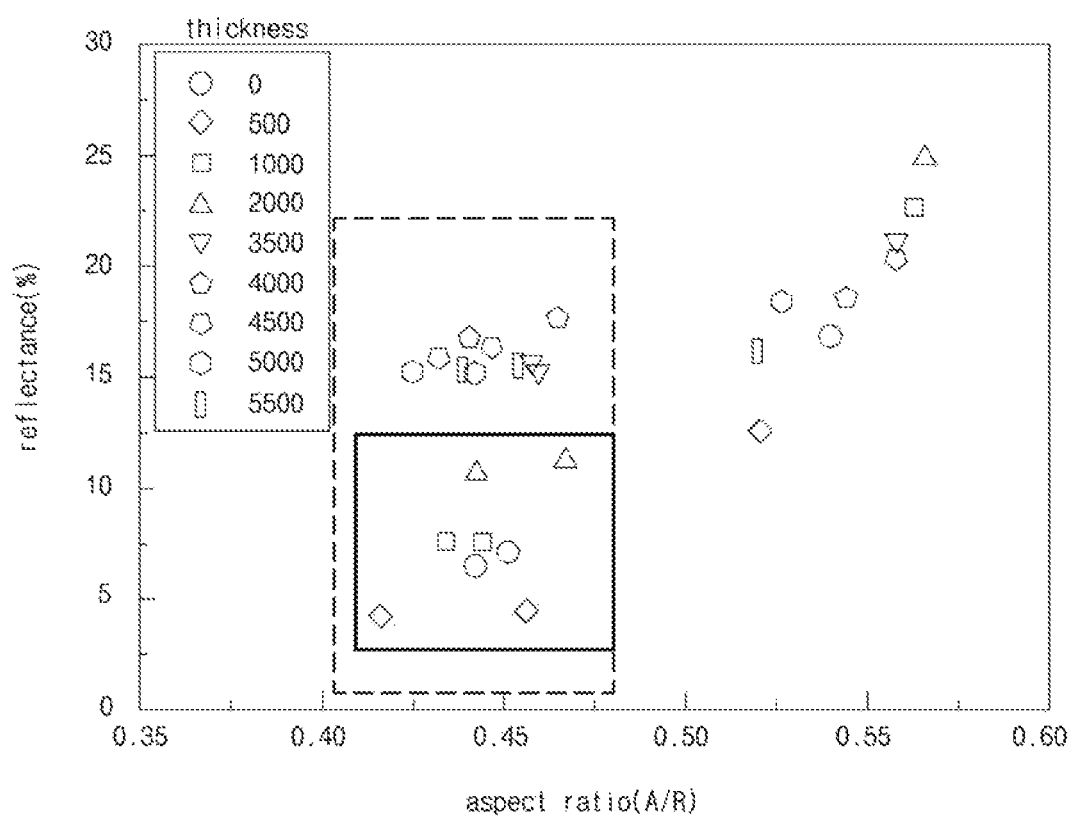
FIG. 6 is a graph showing a reflectance of a microlens with respect to an aspect ratio of a microlens of an organic light emitting diode display device according to an embodiment of the present disclosure.

FIG. 6 is a graph showing a reflectance of a microlens with respect to an aspect ratio of a microlens of an organic light emitting diode display device according to an embodiment of the present disclosure.

In FIG. 6, as the aspect ratio of the microlens ML increases, the reflectance of the microlens ML increases. In addition, the reflectance of the microlens ML varies according to the thickness of the light emitting layer 113 in the similar aspect ratio of the microlens ML.

For example, the reflectance of the microlens ML of the light emitting layer 113 of the thickness smaller than 3500 Å is smaller than the reflectance of the microlens ML of the light emitting layer 113 of the thickness equal to or greater than 3500 Å.

The aspect ratio A/R of the microlens ML can be defined as a value of the height H of the top surface portion 117b of the overcoating layer 108 with respect to the half of the diameter D of the bottom surface portion 117a. For example, the aspect ratio of the microlens ML can have the aspect ratio of 0.4 to 0.5.

When the thickness of the light emitting layer 113 is smaller than 3500 Å, the reflectance with respect to the wavelength is definitely reduced.

Figure 7A:
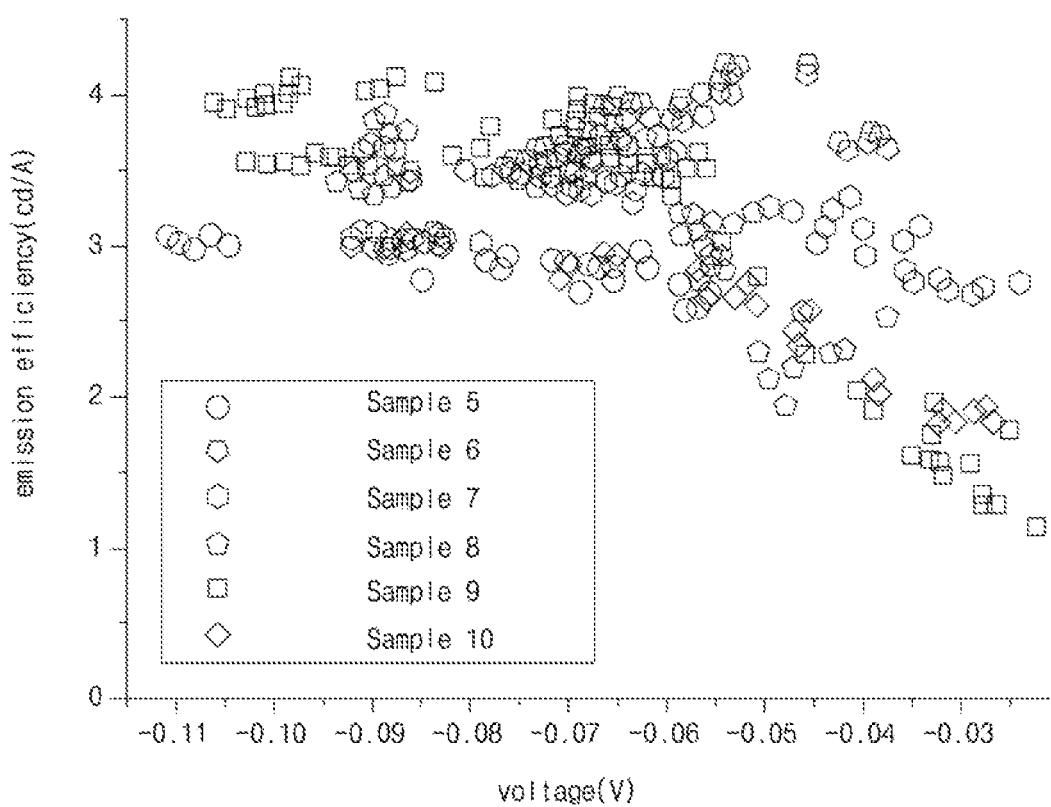
FIGS. 7A, 7B and 7C are graphs showing an emission efficiency according to a voltage of red, green and blue sub-pixels, respectively, of an organic light emitting diode display device according to an embodiment of the present disclosure.
Figure 7B:
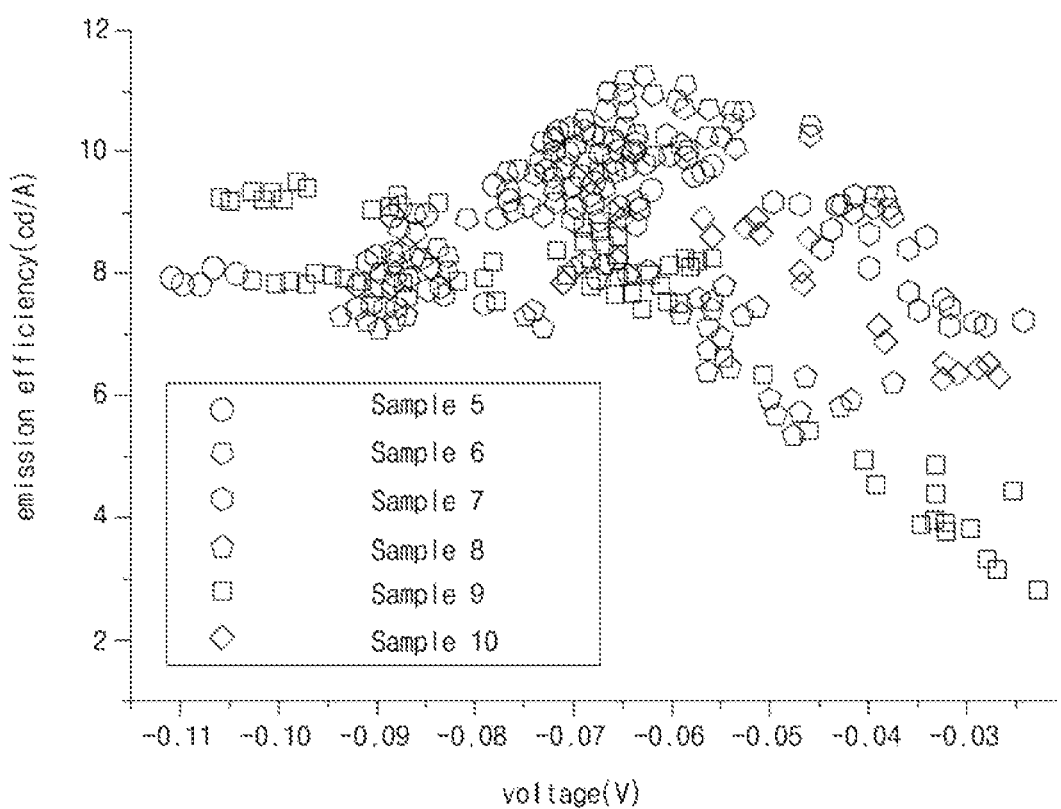
Figure 7C:
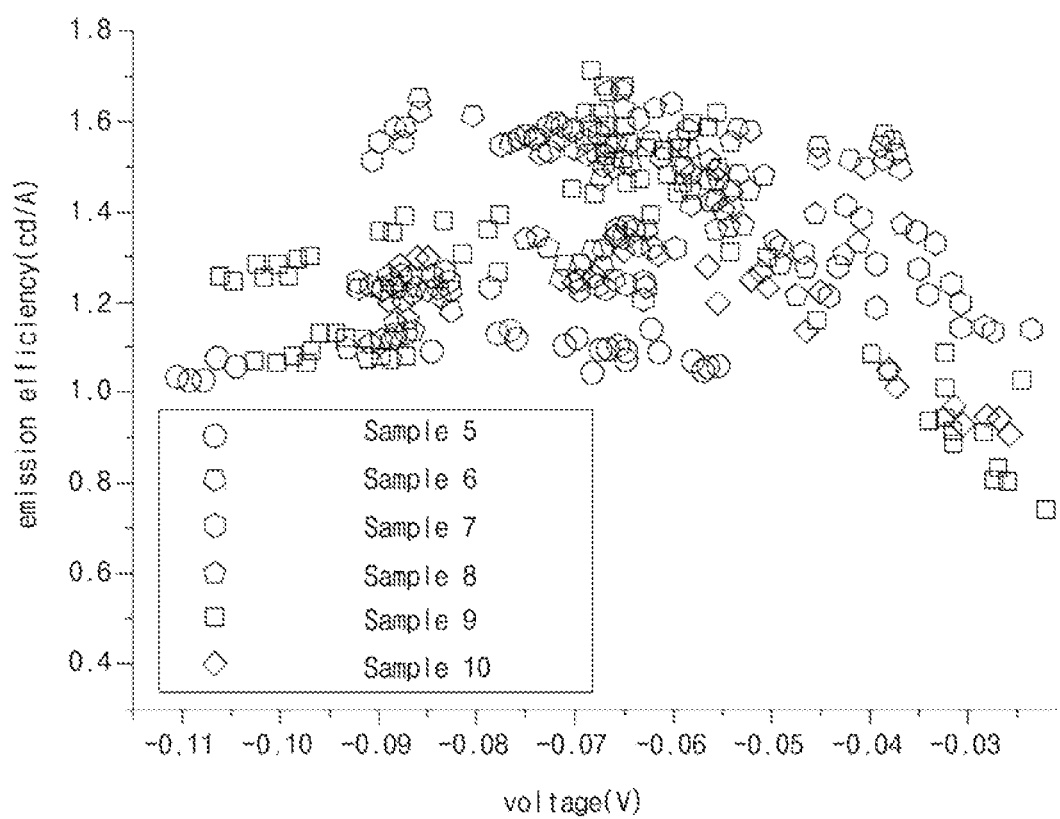

FIGS. 7A, 7B and 7C are graphs showing an emission efficiency according to a voltage of red, green and blue sub-pixels, respectively, of an organic light emitting diode display device according to an embodiment of the present disclosure, and TABLE 1 shows distances from a second electrode to emitting material layers of an organic light emitting diode display device according to the present disclosure.

TABLE 1

|        | Sample 5 | Sample 6 | Sample 7 | Sample 8 | Sample 9 | Sample 10 |
|--------|----------|----------|----------|----------|----------|-----------|
| L1 (Å) | 290      | 460      | 460      | 290      | 290      | 290       |
| L2 (Å) | 1930     | 2380     | 2180     | 1400     | 1100     | 900       |
| L3 (Å) | 2835     | 3530     | 3330     | 2500     | 2300     | 2200      |

In FIGS. 7A, 7B and 7C and TABLE 1, samples 5, 6 and 7 correspond to an organic light emitting diode display device having a microlens without a micro cavity effect where a light emitting layer 113 has a thickness equal to or greater than 3500 Å, and samples 8, 9 and 10 correspond to an organic light emitting diode display device 100 having a microlens with a micro cavity effect according to an embodiment of the present disclosure.

In FIG. 7A, the emission efficiency of the red sub-pixel of the samples 5, 6 and 7 is similar to the emission efficiency of the red sub-pixel of the samples 8, 9 and 10.

In FIG. 7B, the emission efficiency of the green sub-pixel of the samples 5, 6 and 7 is similar to the emission efficiency of the green sub-pixel of the samples 8, 9 and 10.

In FIG. 7C, the emission efficiency of the blue sub-pixel of the samples 5, 6 and 7 is similar to the emission efficiency of the blue sub-pixel of the samples 8, 9 and 10.

Since the first, second and third distances L1, L2 and L3 are determined according to the Equations 7, 8 and 9, the OLED display device 100 has the emission efficiency similar to the OLED display device according to the related art and the reflectance of the light emitting layer 113 is reduced even when the light emitting layer 113 has a thickness greater than 3500 Å.

Since the reflectance is reduced, the reflectance visibility of the black color of the OLED display device 100 in a black state can be improved and a user can recognize a clear black.

For example, since the OLED display device according to the related art has a relatively high reflectance in a black state, a user can not recognize a clear black. However, since the OLED display device 100 has a relatively low reflectance due to the positions of the emitting material layers 203a, 203b and 203c, the reflectance visibility can be improved and a user can recognize a clear black.

In the OLED display device 100, the distances Y1, Y2 and Y3 from the second electrode 115 to the emitting material layers 203a, 203b and 203c in the concave portion 118 are determined based on the distances L1, L2 and L3 from the second electrode 115 to the emitting material layers 203a, 203b and 203c in the convex portion 117 of the effective emission region B according to the Equation 3.

Further, the distances L1, L2 and L3 from the second electrode 115 to the emitting material layers 203a, 203b and 203c in the convex portion 117 of the effective emission region B are determined based on a micro cavity.

As a result, the distances Y1, Y2 and Y3 from the second electrode 115 to the emitting material layers 203a, 203b and 203c in the concave portion 118 are determined different from the distances L1, L2 and L3 from the second electrode 115 to the emitting material layers 203a, 203b and 203c in the convex portion 117 of the effective emission region B.

Thus, according to the embodiments of the present disclosure, the light extraction efficiency is improved and reduction in visibility of the black color due to a relatively high reflectance is prevented in the OLED display device 100.

The present disclosure also relates to and is not limited to the following aspects.

In the present disclosure, the organic light emitting diode display device includes: a substrate; an overcoating layer on the substrate and including a plurality of convex portions and a plurality of concave portions; a first electrode on the overcoating layer; a light emitting layer on the first electrode and including a first emitting material layer; and a second electrode on the light emitting layer, wherein the first emitting material layer in the plurality of convex portions is separated from the second electrode by a first distance, and wherein the first emitting material layer in the plurality of concave portions is separated from the second electrode by a second distance different from the first distance.

In the present disclosure, at least one of the plurality of convex portions includes a bottom surface portion, a top surface portion and a side surface portion between the bottom surface portion and the top surface portion, a slope of the side surface portion increases from the bottom surface portion to the top surface portion, and the side surface portion has a maximum slope at an effective emission region.

In the present disclosure, a distance from the second electrode to the first emitting material layer in the plurality of convex portions is determined by a following equation: L1=D1*cos θ, where θ=20°-60°, and where L1 is a distance from the second electrode to the first emitting material layer in the plurality of convex portions, D1 is a distance from the second electrode to the first emitting material layer in the plurality of concave portions, and θ is an angle of a tangential line of the side surface portion with respect to the bottom surface portion.

In the present disclosure, the organic light emitting diode display device further includes a second emitting material layer between the first emitting material layer and the first electrode, and a distance from the second electrode to the second emitting material layer in the plurality of convex portions is determined by a following equation: L2=D2*cos θ, where θ=20°-60°, and where L2 is a distance from the second electrode to the second emitting material layer in the plurality of convex portions, D2 is a distance from the second electrode to the second emitting material layer in the plurality of concave portions, and θ is an angle of a tangential line of the side surface portion with respect to the bottom surface portion.

In the present disclosure, the organic light emitting diode display device further includes a third emitting material layer between the second emitting material layer and the first electrode, and a distance from the second electrode to the third emitting material layer in the plurality of convex portions is determined by a following equation: L3=((D2+D3)/2)*cos θ, where θ=20°-60°, and where L3 is a distance from the second electrode to the third emitting material layer in the plurality of convex portions, D3 is a distance from the second electrode to the third emitting material layer in the plurality of concave portions, and θ is an angle of a tangential line of the side surface portion with respect to the bottom surface portion.

In the present disclosure, the distance from the second electrode to the first emitting material layer in the plurality of concave portions is within a range of 555 Å to 615 Å, the distance from the second electrode to the second emitting material layer in the plurality of concave portions is within a range of 2735 Å to 3025 Å, and the distance from the second electrode to the third emitting material layer in the plurality of concave portions is within a range of 3450 Å to 3815 Å.

In the present disclosure, a distance from the second electrode to the first emitting material layer in the plurality of concave portions is determined by a following equation: Y1=L1*(1/cos θ), L1≤Y1, and θ=20°-60°, where Y1 is a distance from the second electrode to the first emitting material layer in the plurality of convex portions, L1 is a distance from the second electrode to the first emitting material layer in the plurality of convex portions, and θ is an angle of a tangential line of the side surface portion with respect to the bottom surface portion.

In the present disclosure, the organic light emitting diode display device further includes a second emitting material layer between the first emitting material layer and the first electrode, and a distance from the second electrode to the second emitting material layer in the plurality of concave portions is determined by a following equation: Y2=L2*(1/cos θ), Y2*cos 60°≤L2≤Y2*cos 20°, and θ=20°-60°, where Y2 is a distance from the second electrode to the second emitting material layer in the plurality of convex portions, L2 is a distance from the second electrode to the second emitting material layer in the plurality of convex portions, and θ is an angle of a tangential line of the side surface portion with respect to the bottom surface portion.

In the present disclosure, the organic light emitting diode display device further includes a third emitting material layer between the second emitting material layer and the first electrode, and a distance from the second electrode to the third emitting material layer in the plurality of concave portions is determined by a following equation: Y3=L3*(1/cos θ), Y3*cos 60°≤L3≤Y3*cos 20°, and θ=20°-60°, where Y3 is a distance from the second electrode to the third emitting material layer in the plurality of convex portions, L3 is a distance from the second electrode to the third emitting material layer in the plurality of convex portions, and θ is an angle of a tangential line of the side surface portion with respect to the bottom surface portion.

In the present disclosure, the light emitting layer has a thickness within a range of 3000 Å to 3500 Å.

In the present disclosure, a thickness of the light emitting layer corresponding to the plurality of convex portions is smaller than a thickness of the light emitting layer corresponding to the plurality of concave portions.

In the present disclosure, the first and third emitting material layers emit a light of a first color, and the second emitting material layer emits a light of a second color different from the first color.

In the present disclosure, the first color corresponds to a wavelength within a range of 440 nm to 480 nm, and the second color corresponds to a wavelength within a range of 510 nm to 590 nm.

In the present disclosure, the first emitting material layer, the second emitting material layer and the third emitting material layer include a first blue emitting layer, a yellow-green emitting layer and a second blue emitting layer, respectively.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
a substrate;
an overcoating layer on the substrate and including a plurality of convex portions and a plurality of concave portions;
a first electrode on the overcoating layer;
a light emitting layer having an electron transporting layer, a first emitting material layer, and a second emitting material layer over the first electrode, wherein the electron transporting layer is located between the second electrode and the first emitting material layer; and
a second electrode on the light emitting layer,
wherein the first emitting material layer in the plurality of convex portions is separated from the second electrode by a first distance,
wherein the first emitting material layer in the plurality of concave portions is separated from the second electrode by a second distance different from the first distance,
wherein at least one of the plurality of convex portions includes a bottom surface portion and a side surface portion,
wherein the second emitting material layer is located between the first emitting material layer and the first electrode,
wherein a distance from the second electrode to the second emitting material layer in the plurality of convex portions is determined by a following equation:

$L2 = D2 * \cos\theta$, where $\theta = 20°\text{-}60°$, and where L2 is a distance from the second electrode to the second emitting material layer in the plurality of convex portions, D2 is a distance from the second electrode to the second emitting material layer in the plurality of concave portions, and θ is an angle of a tangential line of the side surface portion with respect to the bottom surface portion.

2. The organic light emitting diode display device of claim 1, wherein at least one of the plurality of convex portions includes the bottom surface portion, a top surface portion and the side surface portion between the bottom surface portion and the top surface portion,
wherein a slope of the side surface portion increases from the bottom surface portion to the top surface portion, and
wherein the side surface portion has a maximum slope at an effective emission region.

3. The organic light emitting diode display device of claim 2, wherein a distance from the second electrode to the first emitting material layer in the plurality of convex portions is determined by a following equation:

$L1 = D1 * \cos\theta$, where $\theta = 20°\text{-}60°$, and where L1 is a distance from the second electrode to the first emitting material layer in the plurality of convex portions, D1 is a distance from the second electrode to the first emitting material layer in the plurality of concave portions, and θ is an angle of a tangential line of the side surface portion with respect to the bottom surface portion.

4. The organic light emitting diode display device of claim 1, further comprising a third emitting material layer between the second emitting material layer and the first electrode,
wherein a distance from the second electrode to the third emitting material layer in the plurality of convex portions is determined by a following equation:

$L3 = ((D2+D3)/2) * \cos\theta$, where $\theta = 20°\text{-}60°$ and where L3 is a distance from the second electrode to the third emitting material layer in the plurality of convex portions, D3 is a distance from the second electrode to the third emitting material layer in the plurality of concave portions, and θ is an angle of a tangential line of the side surface portion with respect to the bottom surface portion.

5. The organic light emitting diode display device of claim 4, wherein the distance from the second electrode to the first emitting material layer in the plurality of concave portions is within a range of 555 Å to 615 Å,
wherein the distance from the second electrode to the second emitting material layer in the plurality of concave portions is within a range of 2735 Å to 3025 Å, and
wherein the distance from the second electrode to the third emitting material layer in the plurality of concave portions is within a range of 3450 Å to 3815 Å.

6. The organic light emitting diode display device of claim 2, wherein a distance from the second electrode to the first emitting material layer in the plurality of concave portions is determined by a following equation:

$Y1 = L1 * (1/\cos\theta)$, $L1 \leq Y1$, and $\theta = 20°\text{-}60°$, where Y1 is a distance from the second electrode to the first emitting material layer in the plurality of convex portions, L1 is a distance from the second electrode to the first emitting material layer in the plurality of convex portions, and θ is an angle of a tangential line of the side surface portion with respect to the bottom surface portion.

7. The organic light emitting diode display device of claim 6, further comprising a second emitting material layer between the first emitting material layer and the first electrode,
wherein a distance from the second electrode to the second emitting material layer in the plurality of concave portions is determined by a following equation:

$Y2 = L2 * (1/\cos\theta)$, $Y2 * \cos 60° \leq L2 \leq Y2 * \cos 20°$, and $\theta = 20°\text{-}60°$, where Y2 is a distance from the second electrode to the second emitting material layer in the plurality of convex portions, L2 is a distance from the second electrode to the second emitting material layer in the plurality of convex portions, and θ is an angle of a tangential line of the side surface portion with respect to the bottom surface portion.

8. The organic light emitting diode display device of claim 7, further comprising a third emitting material layer between the second emitting material layer and the first electrode, wherein a distance from the second electrode to the third emitting material layer in the plurality of concave portions is determined by a following equation:

$Y3=L3*(1/\cos θ)$, $Y3*\cos 60° \leq L3 \leq Y3*\cos 20°$, and $θ=20°\text{-}60°$ where Y3 is a distance from the second electrode to the third emitting material layer in the plurality of convex portions, L3 is a distance from the second electrode to the third emitting material layer in the plurality of convex portions, and θ is an angle of a tangential line of the side surface portion with respect to the bottom surface portion.

9. The organic light emitting diode display device of claim 8, wherein the light emitting layer has a thickness within a range of 3000 Å to 3500 Å.

10. The organic light emitting diode display device of claim 1, wherein a thickness of the light emitting layer corresponding to each of the plurality of convex portions is smaller than a thickness of the light emitting layer corresponding to each of the plurality of concave portions.

11. The organic light emitting diode display device of claim 8, wherein the first and third emitting material layers emit a light of a first color, and the second emitting material layer emits a light of a second color different from the first color.

12. The organic light emitting diode display device of claim 11, wherein the first color corresponds to a wavelength within a range of 440 nm to 480 nm, and the second color corresponds to a wavelength within a range of 510 nm to 590 nm.

13. The organic light emitting diode display device of claim 8, wherein the first emitting material layer, the second emitting material layer and the third emitting material layer include a first blue emitting layer, a yellow-green emitting layer and a second blue emitting layer, respectively.

* * * * *